(12) United States Patent
Liu et al.

(10) Patent No.: US 12,153,346 B2
(45) Date of Patent: *Nov. 26, 2024

(54) PHOTORESIST FOR SEMICONDUCTOR FABRICATION

(71) Applicant: Taiwan Semiconductor Manufacturing Company, Ltd., Hsinchu (TW)

(72) Inventors: Chih-Cheng Liu, Hsinchu (TW); Yi-Chen Kuo, Hsinchu (TW); Yen-Yu Chen, Hsinchu (TW); Jr-Hung Li, Hsinchu County (TW); Chi-Ming Yang, Hsinchu (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 840 days.

This patent is subject to a terminal disclaimer.

(21) Appl. No.: 17/177,837

(22) Filed: Feb. 17, 2021

(65) Prior Publication Data
US 2022/0100087 A1 Mar. 31, 2022

Related U.S. Application Data

(60) Provisional application No. 63/085,364, filed on Sep. 30, 2020.

(51) Int. Cl.
*G03F 7/004* (2006.01)
*G03F 7/16* (2006.01)

(52) U.S. Cl.
CPC .......... *G03F 7/0042* (2013.01); *G03F 7/0048* (2013.01); *G03F 7/168* (2013.01)

(58) Field of Classification Search
CPC ..... G03F 7/0042; G03F 7/0043; G03F 7/0044
See application file for complete search history.

(56) References Cited

U.S. PATENT DOCUMENTS

| | | | |
|---|---|---|---|
| 10,741,410 B2 | 8/2020 | Zi et al. | |
| 11,726,405 B2 * | 8/2023 | Liu | C07F 5/003 430/270.1 |
| 2014/0099573 A1 | 4/2014 | Weitekamp | |
| 2015/0118188 A1 * | 4/2015 | Weitekamp | A61L 27/16 522/63 |
| 2017/0146909 A1 * | 5/2017 | Smith | G03F 7/0042 |
| 2018/0067393 A1 | 3/2018 | Weitekamp | |
| 2019/0337969 A1 | 11/2019 | Odedra | |
| 2019/0384171 A1 * | 12/2019 | Zi | G03F 7/322 |
| 2020/0073238 A1 | 3/2020 | Zi et al. | |
| 2020/0110338 A1 | 4/2020 | Zi et al. | |
| 2020/0272051 A1 | 8/2020 | Ho et al. | |

FOREIGN PATENT DOCUMENTS

| | | |
|---|---|---|
| KR | 20180054509 A | 5/2018 |
| KR | 20180063182 A | 6/2018 |
| WO | 2015065649 A1 | 5/2015 |

\* cited by examiner

*Primary Examiner* — Daborah Chacko-Davis
(74) *Attorney, Agent, or Firm* — HAYNES AND BOONE, LLP

(57) ABSTRACT

An organometallic precursor for extreme ultraviolet (EUV) lithography is provided. An organometallic precursor includes a chemical formula of $M_aX_bL_c$, where M is a metal, X is a multidentate aromatic ligand that includes a pyrrole-like nitrogen and a pyridine-like nitrogen, L is an extreme ultraviolet (EUV) cleavable ligand, a is between 1 and 2, b is equal to or greater than 1, and c is equal to or greater than 1.

20 Claims, 16 Drawing Sheets

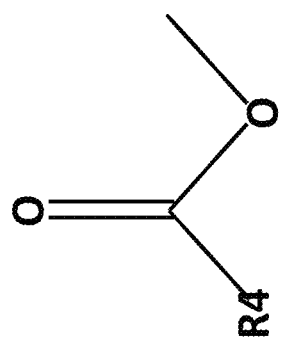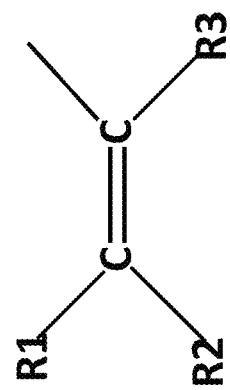
Fig. 5

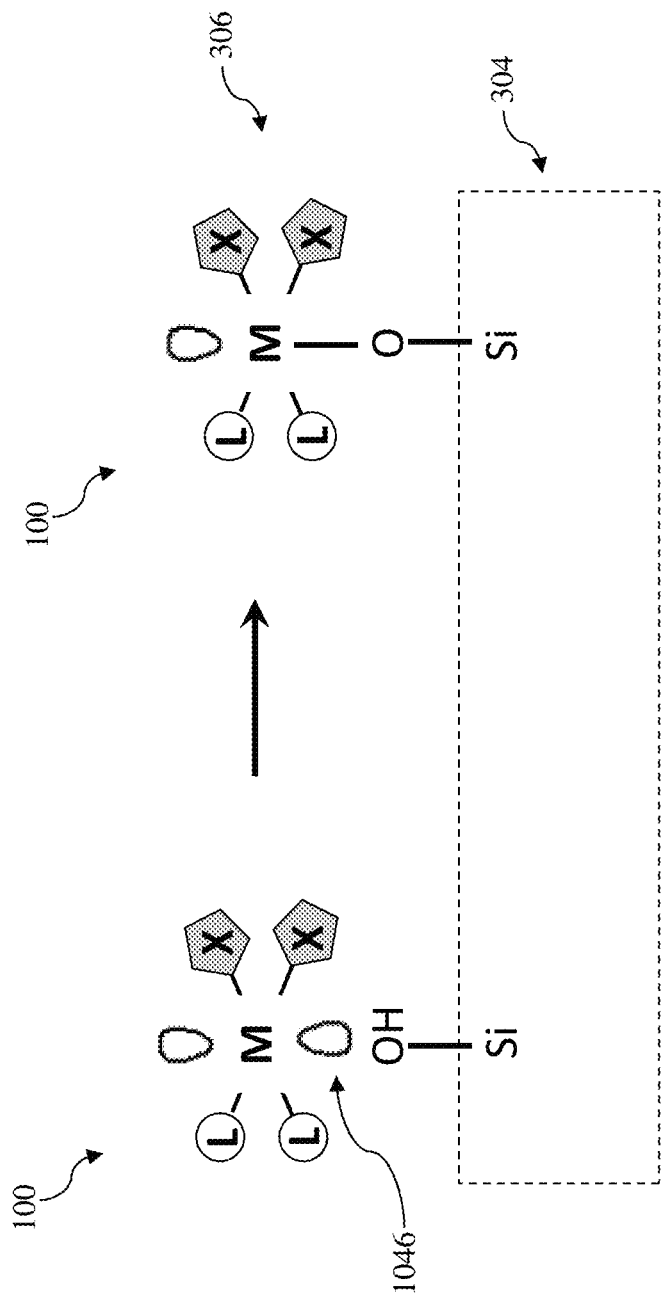

PHOTORESIST FOR SEMICONDUCTOR FABRICATION

PRIORITY DATA

This application claims priority to U.S. Provisional Patent Application Ser. No. 63/085,364 filed on Sep. 30, 2020, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

In one exemplary aspect, photolithography is a process used in semiconductor micro-fabrication to selectively remove parts of a material layer. The process uses a radiation source to transfer a pattern (e.g., a geometric pattern) from a photomask to a photo-sensitive layer (e.g., a photoresist layer) on the material layer. The radiation causes a chemical change (e.g., increasing or decreasing solubility) in exposed regions of the photo-sensitive layer. Bake processes may be performed before and/or after exposure, such as in a pre-exposure and/or a post-exposure bake process. A developing process then selectively removes the exposed or unexposed regions with a developer solution forming an exposure pattern in the material layer. To improve the resolution of the photolithography process to accommodate IC devices of high functional density, radiation sources with shorter wavelengths have emerged. One of them is an extreme ultraviolet (EUV) radiation source. Although existing EUV photoresists are generally adequate for their intended purposes, they have not been entirely satisfactory. Additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 illustrates example EUV-cleavable ligands of the organometallic precursor in FIG. 1, according to various aspects of the present disclosure.

FIG. 16 illustrates an example mechanism for an organometallic precursor according to the present disclosure to coordinate with a functional group on a material layer, according to various aspects of the present disclosure.

DETAILED DESCRIPTION

Figure 1:
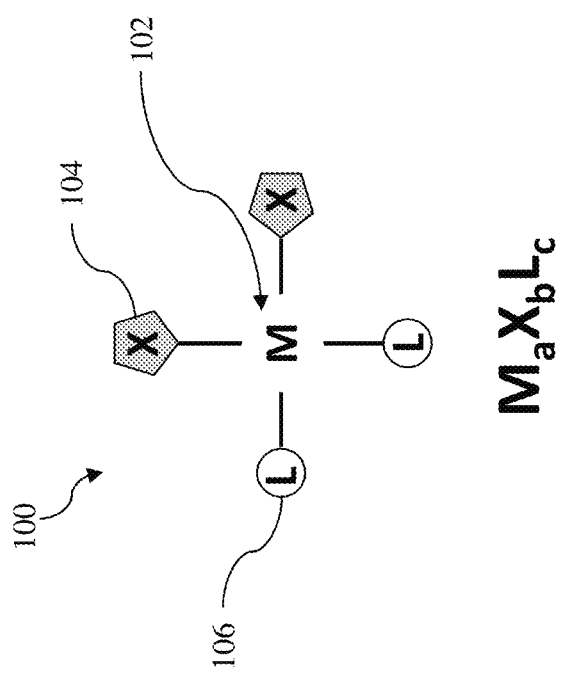
FIG. 1 schematically illustrates a molecular structure of an organometallic precursor, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure relates generally to EUV photolithography and, more particularly, to an organometallic precursor in EUV photoresists.

Some existing EUV photoresists come in the form of a solution that includes a cation species and an anion species. The anion species includes a metal ion coordinated with EUV-stable ligands and bridge ligands. The bridge ligands function as cross-linkers to coordinate to another metal ion. Example bridge ligands in some existing EUV may include an oxalate ion ($C_2O_4^{2-}$). Such EUV photoresists have poor adhesion to various surfaces. To improve adhesion, surface treatments or adhesion promoting layers are required ensure satisfactory adhesion. Examples of the adhesion promoting layers may include hexamethyldisilanzne (HMDS). In addition, because the bridge ligands are EUV-cleavable and cross-linkers at the same time, it is difficult to control the EUV-induced cross-linking process well. On the one hand, some bridge ligand need to be cleaved off from metal ions to create non-coordinated sites for crosslinking. On the other hand, some bridge ligands need to remain coordinated to the metal ions to serve as a cross-linker. When no bridges ligands are cleaved off or all bridge ligands are cleaved off, crosslinking may be unsatisfactory.

The present disclosure provides an organometallic precursor in a photoresist that may adhere well to various surfaces without surface treatments or adhesion promoting layers and may crosslink in a well-controlled manner. The organometallic precursor of the present disclosure includes a metal ion coordinated to a plurality of multidentate aromatic ligands and a plurality of EUV-cleavable ligands. The multidentate aromatic ligand includes a conjugation structure, a pyrrole-like nitrogen, and a pyridine-like nitrogen. The EUV-cleavable ligand includes an alkenyl group or a carboxylate group. Each of the multidentate aromatic ligands is coordinated to the metal ion via the pyrrole-like nitrogen. When the organometallic precursor is irradiated with EUV radiation, the pyrrole-like nitrogen atoms of the multidentate aromatic ligands are activated and the EUV-cleavable ligands are cleaved off of the metal ion. The activated pyrrole-like nitrogen may be coordinated to another metal ion at coordinate sites left vacant due to the cleavage of the EUV-cleavable ligands. The metal ions have high atomic absorption cross section, allowing available coordination sites to bond to various surface functional groups. The manner of crosslinking and degree of crosslinking may be well controlled by controlling the stoichiometry ratio of the EUV-cleavable ligands and the multidentate aromatic ligands.

FIG. 1 illustrates a schematic molecular structure of an organometallic precursor 100 according to aspects of the present disclosure. The organometallic precursor 100 includes a metal ion (M) 102, a plurality of multidentate aromatic ligands (X) 104 coordinated to the metal ion 102, and a plurality of EUV-cleavable ligands (L) 106 coordinated to the metal ion 102. Alternatively, the organometallic precursor 100 may also be represented as $M_aX_bL_c$, where M denotes the metal ion 102, L denotes the EUV-cleavable ligand 106, X denotes the multidentate aromatic ligand 106, "a" is between about 1 and 2, "b" is equal to or greater than 1, and "c" is equal to or greater than 1. The sum of "b" and "c" is smaller than the available coordination sites of the metal ion 102 so as to leave at least one non-coordinated site to improve adhesion. When the organometallic precursor 100 is in a photoresist and the photoresist is to be deposited on a material layer, the at least one non-coordinated site may bond to a surface functional group, such as a hydroxyl group on a silicon oxide layer or a metal oxide layer or an amine group on a silicon nitride layer. The at least one non-coordinated site of the organometallic precursor 100 allows good adhesion without surface treatment or an additional adhesion layer. The metal ion 102 may include a metal that has a high atomic absorption cross section. Examples of the metal ion 102 may include tin (Sn), bismuth (Bi), antimony (Sb), indium (In), or tellurium (Te). As the metal ion 102 may have six (6) coordination sites, the sum of "b" and "c" (i.e., the total number of the EUV-cleavable ligands (L) 106 and the multidentate aromatic ligand (X) 104) may not exceed 5 to leave at least one unsaturated site (i.e., uncoordinated site). Different from some existing organometallic precursors that are in ion forms and stabilized by a counter ion, the organometallic precursor 100 is charge-neutral. In some embodiments, the organometallic precursor 100 of the present disclosure may be prepared ex-situ and then deposited on a semiconductor device workpiece using spin-on coating. In some other embodiments, the organometallic precursor 100 may be deposited on a semiconductor device workpiece using chemical vapor deposition (CVD) or atomic layer deposition (ALD).

Figure 2:
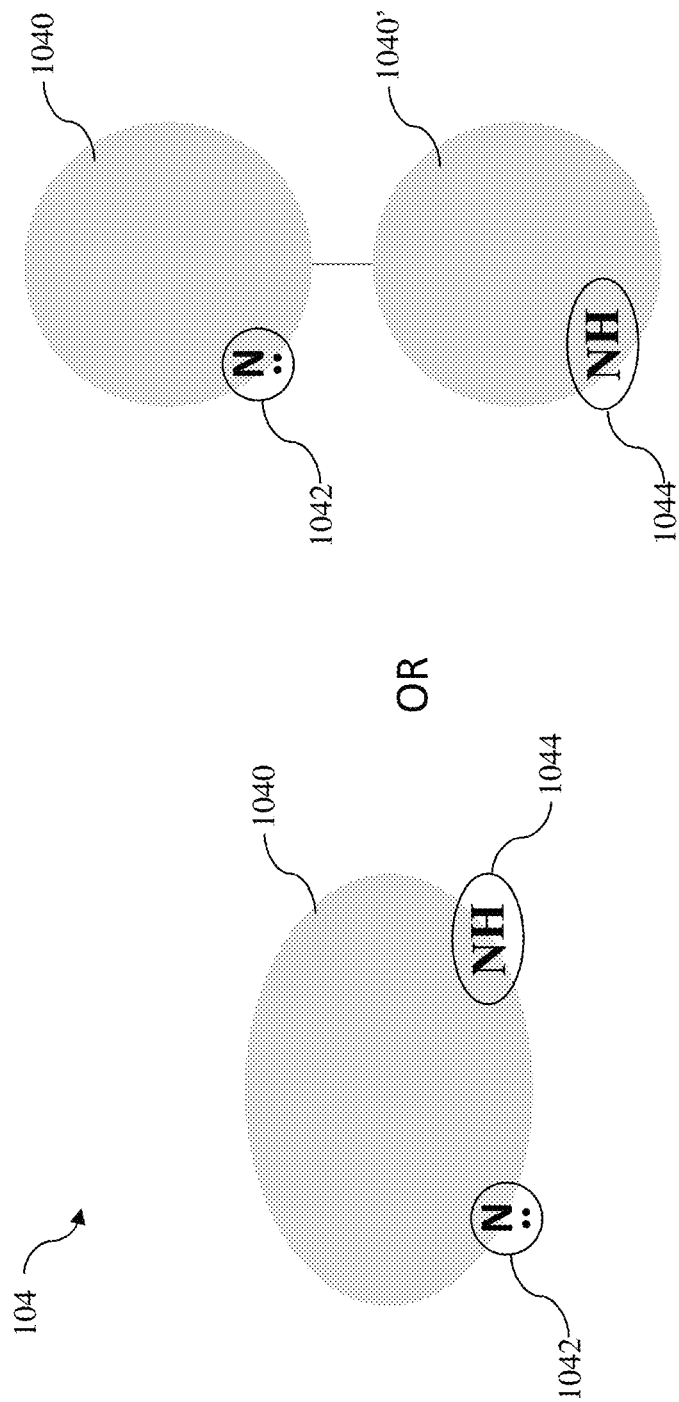
FIGS. 2A and 2B schematically illustrate representative structures of a multidentate aromatic ligand of the organometallic precursor in FIG. 1, according to various aspects of the present disclosure.

FIGS. 2A and 2B schematically illustrate representative structures of the multidentate aromatic ligand 104 of the organometallic precursor 100 in FIG. 1. In one embodiment as shown in FIG. 2A, the multidentate aromatic ligand 104 includes a conjugation structure 1040, a pyrrole-like nitrogen 1044, and pyridine-like nitrogen 1042, where the pyrrole-like nitrogen 1044 and the pyridine-like nitrogen 1042 are part of the aromatic ring of the conjugation structure 1040. The conjugation structure 1040 may include carbon (C) atoms, phosphorus (P) atoms, oxygen (O) atoms, sulfur (S) atoms, selenium (Se) atoms or boron (B) atoms that have overlapping p orbitals and delocalization of π electrons. In other words, the conjugation structure 1040 includes a π system (or a π conjugated system). The pyridine-like nitrogen 1042, as its name suggests, is linked or situated in a way similar to the nitrogen in a pyridine molecule. The pyridine-like nitrogen 1042 has a lone electron pair that is part of the π system of the conjugation structure. The pyrrole-like nitrogen 1044, as its name suggests, is linked or situated in a way similar to the nitrogen in a pyrrole molecule. The pyrrole-like nitrogen 1044 also has a lone electron pair. Unlike the lone electron pair of the pyridine-like nitrogen 1042, the lone electron pair of the pyrrole-like nitrogen 1044 is not part of the π system of the conjugation structure. In another embodiment illustrated in FIG. 2B, the multidentate aromatic ligand 104 includes a conjugation structure 1040, a linked conjugation structure 1040', a pyridine-like nitrogen 1042 bonded to the conjugation structure 1040, and a pyrrole-like nitrogen 1044 bonded to the linked conjugation structure 1040'. Similar to the embodiment shown in FIG. 2A, the conjugation structure 1040 and the linked conjugation structure 1040' may include carbon (C) atoms, phosphorus (P) atoms, oxygen (O) atoms, sulfur (S) atoms, selenium (Se) or boron B) atom that have overlapping p orbitals and delocalization of π electrons. In other words, each of the conjugation structure 1040 and the linked conjugation structure 1040' includes a π system (or a π conjugated system). In the embodiment illustrated in FIG. 2B, the pyridine-like nitrogen 1042 has a lone electron pair that is part of the π system of the conjugation structure 1040.

The lone electron pair of the pyrrole-like nitrogen 1044 is not part of the π system of the linked conjugation structure 1040' nor part of the π system of the conjugation structure 1040. For ease of description, the multidentate aromatic ligand 104 of the present disclosure may be regarded as including a conjugation structure 1040, a pyrrole-like nitrogen 1044, and pyridine-like nitrogen 1042. When the multidentate aromatic ligand 104 includes more than one conjugation structures, the description of one conjugation structure generally applies to the other conjugation structure.

The conjugation structure 1040 may have include a 5-member heterocyclic ring, a 6-member heterocyclic ring, or a combination thereof. In some embodiments, the conjugation structure 1040 may include two or more 5-member heterocyclic rings linked or fused together, two or more 6-member heterocyclic rings linked or fused together, at least one 5-member heterocyclic ring and at least one 6-member heterocyclic ring linked or fused together. Because the conjugation structure 1040 includes a π system and a ring-containing structure, the conjugation structure 1040 includes unsaturated ring(s) and may be referred to as an aromatic structure 1040 as well.

Each of the pyrrole-like nitrogen 1044 and the pyridine-like nitrogen 1042 may donate a pair of electrons. For that reason, each of them may provide a denticity. As the multidentate aromatic ligand 104 includes at least a pyrrole-like nitrogen 1044 and a pyridine-like nitrogen 1042, the multidentate aromatic ligand 104 is capable of providing more than one denticity and is therefore "multidentate." The multidentate aromatic ligand 104 may include between 2 and 4 denticities. In some embodiments, the multidentate aromatic ligand 104 is coordinated with the metal ion 102 via the pyridine-like nitrogen 1042 and the pyrrole-like nitrogen 1044 remains un-coordinated. As will be described further below, EUV radiation may activate the pyrrole-like nitrogen 1044 to link to coordinate to another metal ion. When that happens, the pyrrole-like nitrogen 1044 and the pyridine-like nitrogen 1042 of a multidentate aromatic ligand 104 are coordinated to two metal ions 102, thereby bridging them. In this regard, the multidentate aromatic ligand 104 functions a bridge ligand that forms a bridge upon irradiation of EUV radiation.

While not explicitly shown in the figures, in some alternative embodiments, at least one of the pyrrole-like nitrogen 1044 and the pyridine-like nitrogen 1042 may be replaced with a thiophene-like sulfur (S), selenophene-like selenium (Se), thiazole-like sulfur (S), selenazole-like selenium (Se), furan-like oxygen (O), oxazole-like oxygen (O), diazaborinine-like boron (B), bis(methylamin)boron-like boron (B), a triphosphole-like phosphorus (P), or other electron-donating forms of sulfur (S), selenium (Se), oxygen (O), boron (B), or phosphorus (P). Some of these replacements may have a lone electron pair that is a part of the a system of the multidentate aromatic ligand 104. Some of them may have a lone electron pair that is not part of the π system of the multidentate aromatic ligand 104. Some of them may have one lone electron pair in the π system and another lone electron pair that is outside of the π system. Like the pyrrole-like nitrogen 1044 or the pyridine-like nitrogen 1042, the replacement sulfur (S), selenium (Se), phosphorus (P), boron (B), or oxygen (O) may also provide a denticity and serve as a part of the bridge ligand—the multidentate aromatic ligand 104. Although the present disclosure describes the pyrrole-like nitrogen 1044 and the pyridine-like nitrogen 1042 in more detail, similar mechanisms and applications may apply similarly to these alternative embodiments.

Figure 3:
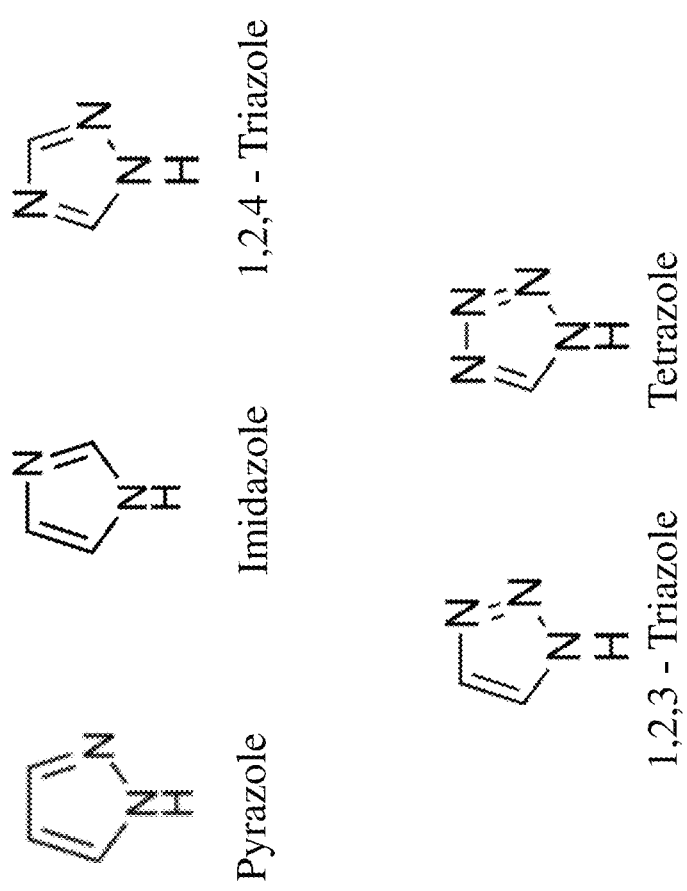
FIG. 3 illustrates example single-ring multidentate aromatic ligands of the organometallic precursor in FIG. 1, according to various aspects of the present disclosure.

FIG. 3 illustrates example single-ring multidentate aromatic ligands 104. These example single-ring multidentate aromatic ligands 104 generally correspond to the embodiment illustrated in FIG. 2A, where there is only one conjugation structure 1040. These examples include pyrazole, imidazole, 1,2,4-triazole, 1,2,3-triazole, and tetrazole. As can be seen in FIG. 3, each of these examples includes a conjugation structure that has a π system, at least one pyrrole-like nitrogen, and at least one pyridine-like nitrogen. Although not explicitly shown, the examples shown in FIG. 3 may also extend to their derivatives where the hydrogen atoms are substituted with an alkyl group, an alkenyl group, or a fluorine.

Figure 4:
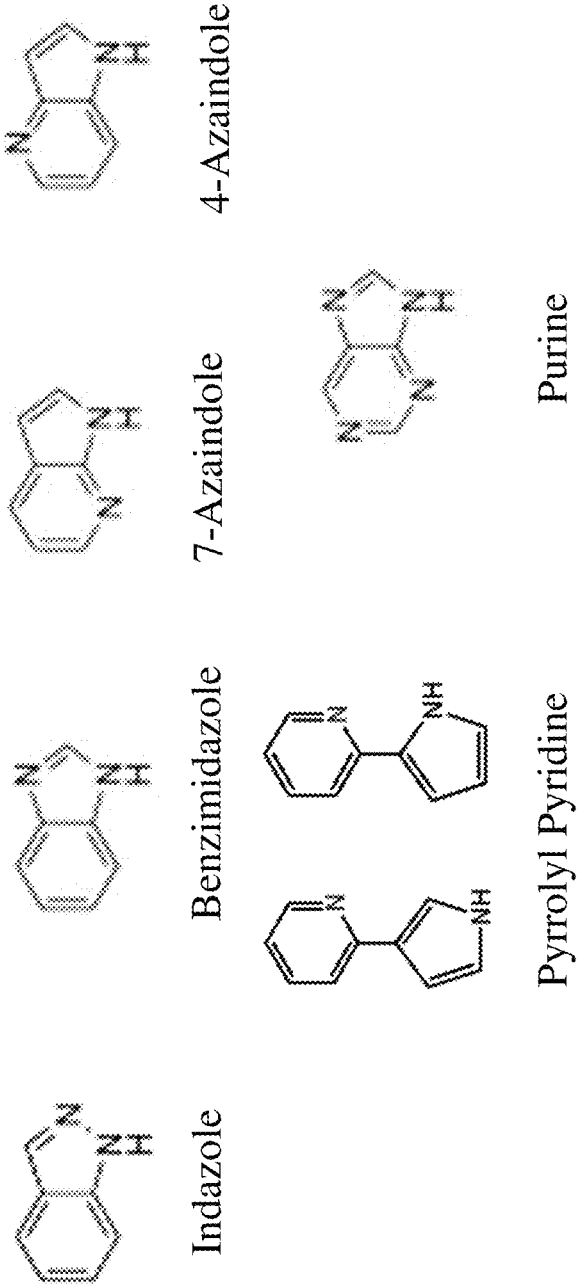
FIG. 4 illustrates example multi-ring multidentate aromatic ligands of the organometallic precursor in FIG. 1, according to various aspects of the present disclosure.

FIG. 4 illustrates example multi-ring multidentate aromatic ligands 104. These example multi-ring multidentate aromatic ligands 104 generally correspond to the embodiment illustrated in FIG. 2B, where there are a conjugation structure 1040 and a linked conjugation structure 1040'. These examples include indazole, benzimidazole, 7-azaindole, 4-azaindole, pyrrolyl pyridine, or purine. As can be seen in FIG. 4, each of these examples includes a conjugation structure that has a π system, at least one pyrrole-like nitrogen, and at least one pyridine-like nitrogen. Although not explicitly shown, the examples shown in FIG. 4 may also extend to their derivatives where the hydrogen atoms are substituted with an alkyl group, an alkenyl group, or a fluorine.

FIG. 5 illustrates example EUV-cleavable ligands 106. These examples include an alkenyl group or a carboxylate group. Groups R1, R2 and R3 in the alkenyl group may include hydrogen, fluorine, or an alkyl group. Groups R4 in the carboxylate group may include hydrogen, fluorine or an alkyl group. Groups R1, R2, R3, and R4 may be the same or different. Alkyl groups in these example EUV-cleavable ligands may be linear, branched or cyclic and may include 1 to 6 carbon atoms. Both the alkenyl group and the carboxylate group include a double bond, which may be severed by incidence of EUV radiation, giving these example EUV-cleavable ligands their EUV cleavable property.

Figure 6:
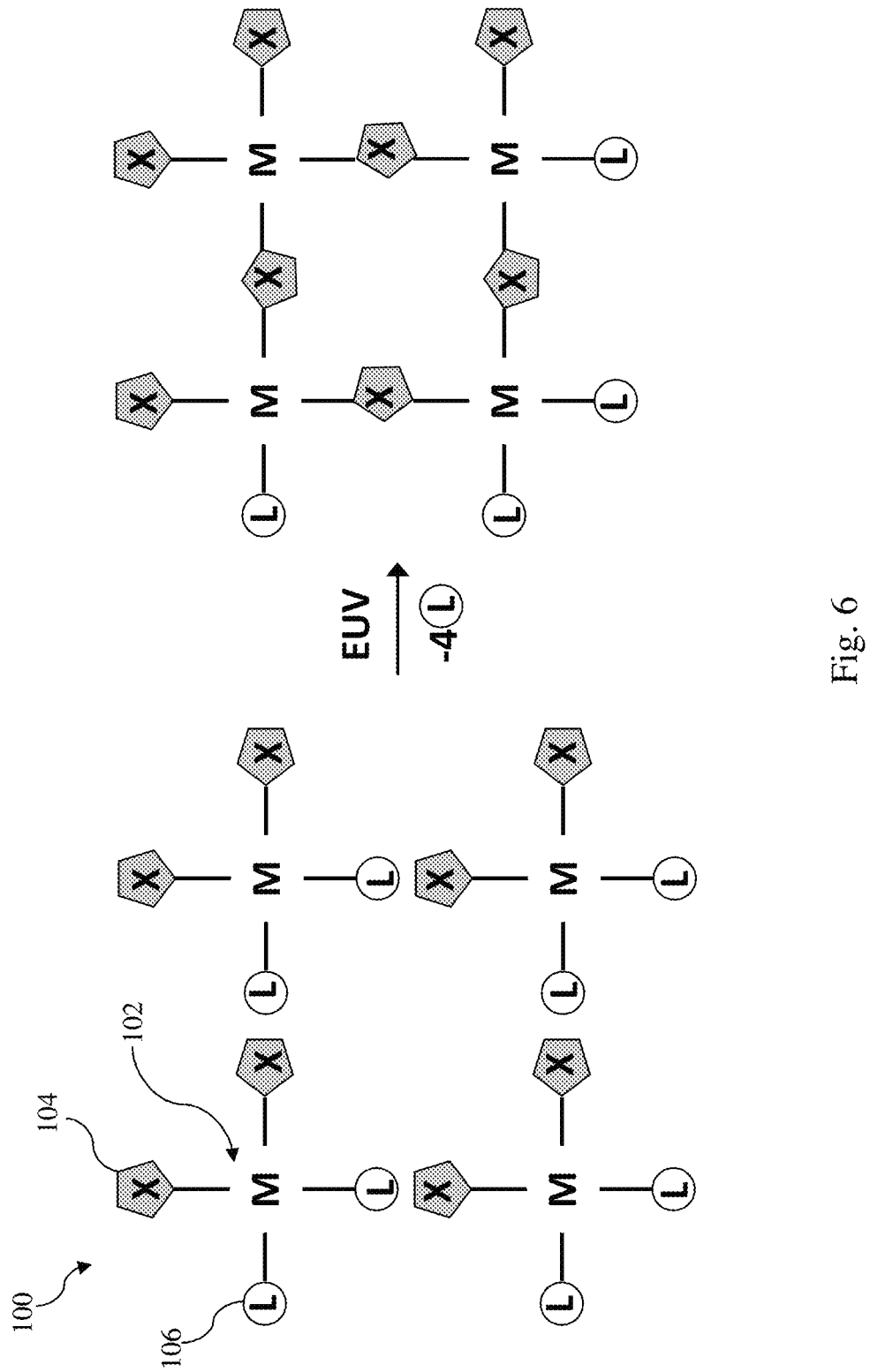
FIG. 6 illustrates the organometallic precursor in FIG. 1 undergoing a reduction reaction, according to various aspects of the present disclosure.

FIG. 6 illustrates the organometallic precursor 100 undergoing a reduction reaction, according to various aspects of the present disclosure. For ease of illustration, only four organometallic precursors 100 are shown in FIG. 6. Upon incidence of EUV radiation, at least one EUV-cleavable ligand (L) 106 is cleaved off from each of the four organometallic precursors 100 to provide coordination sites for metal ions 102. Moreover, the EUV radiation may break the nitrogen-hydrogen (N—H) bond of the pyrrole-like nitrogen such that the pyrrole-like nitrogen loses a hydrogen and the nitrogen-site (N-site) of the pyrrole-like nitrogen becomes activated. The EUV-cleavable ligand (L) 106 and the hydrogen may combine to form a leaving group. The activated N-site of the pyrrole-like nitrogen of a multidentate aromatic ligand 104 may coordinate to a coordination site of a metal ion 102 left vacant by the leaving EUV-cleavable ligand 106. The reduction of the EUV-cleavable ligand (L) 106 and the hydrogen lead to crosslinking of the four organometallic precursors 100. Some of the multidentate aromatic ligands 104 extend between two metal ions 102 and function as bridge ligands.

Figure 7:
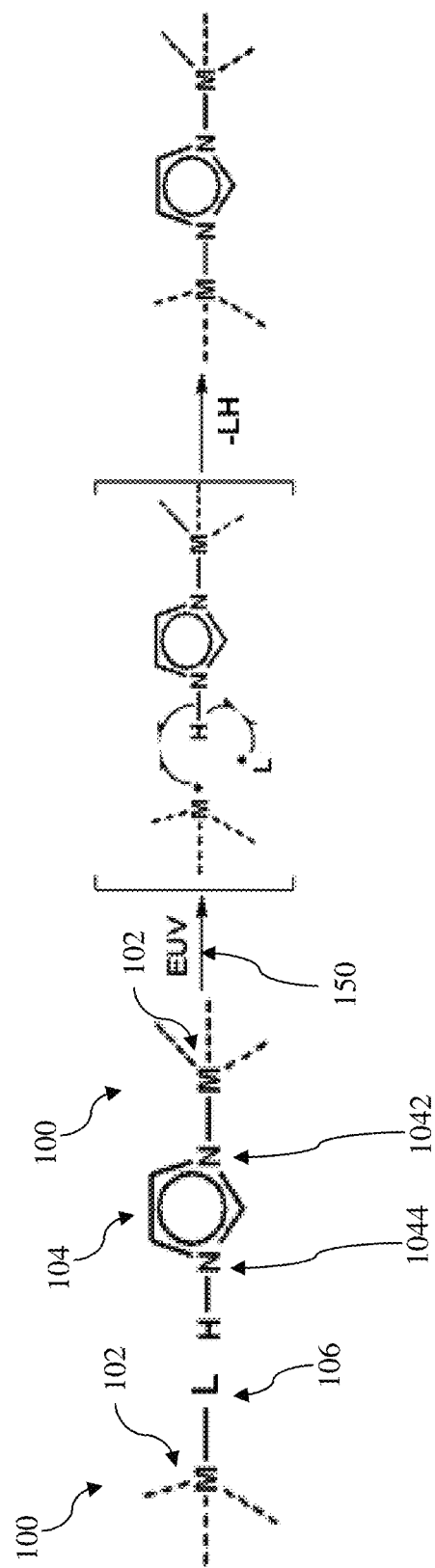
FIG. 7 illustrates an example organic metallic precursor undergoing a reduction reaction, according to various aspects of the present disclosure.

The reduction reaction in FIG. 6 is further illustrated using an example. In the example illustrated in FIG. 7, the organometallic precursor 100 includes a metal ion 102 that is coordinated to an EUV-cleavable ligand (L) 106 and imidazole as an example of the multidentate aromatic ligand 104. More particularly, the imidazole is coordinated to the metal ion 102 via the pyrrole-like nitrogen 1044 and the pyridine-like nitrogen 1042 is left un-coordinated. Upon incidence of EUV radiation 150, the EUV-cleavable ligand (L) 106 is cleaved off from the metal ion 102 by radicals generated by the EUV radiation 150, leaving behind a vacant coordination site of the metal ion 102. The EUV radiation 150 also cleave the bond between the hydrogen and the pyrrole-like nitrogen 1044, thereby activating the pyrrole-like nitrogen 1044. The EUV-cleavable ligand (L) 106 and the severed hydrogen may form a leaving group (LH) and the activated pyrrole-like nitrogen 1044 may coordinate with the vacant coordination site. As a result, the multidentate aromatic ligand 104 bridges two metal ions 102 with its two denticities.

Figure 8:
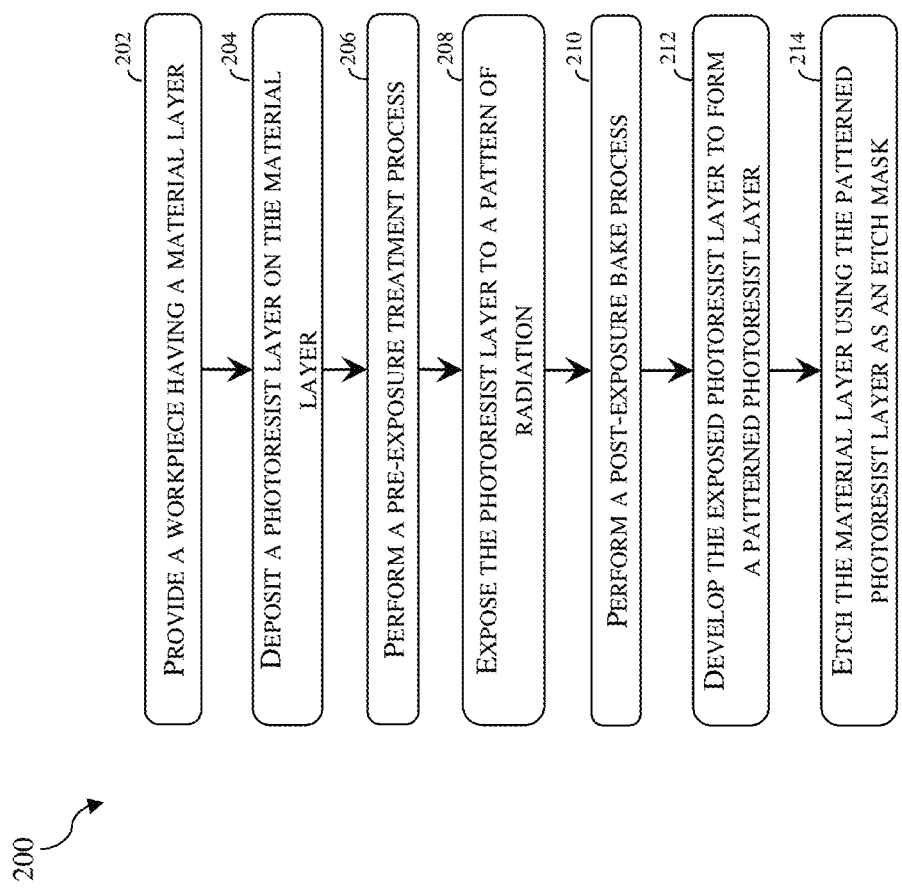
FIG. 8 illustrates a flowchart of a method 200 for patterning a workpiece, according to various aspects of the present disclosure.

Generally speaking, a positive photoresist (or a positive tone photoresist) is a type of photoresist in which the portion of the photoresist that is exposed to light becomes soluble to the photoresist developer. The unexposed portion of the photoresist remains insoluble to the photoresist developer. A negative photoresist (or a negative tone photoresist) is a type of photoresist in which the portion of the photoresist that is exposed to light becomes insoluble to the photoresist developer. The unexposed portion of the photoresist is dissolved by the photoresist developer. Because EUV irradiation forms crosslinks to reduce solubility of the organometallic precursor 100 in a developer, the organometallic precursor 100 may be an active ingredient in a negative photoresist for EUV lithography. FIG. 8 illustrates a flowchart of a method 200 for patterning a material layer on a workpiece using a negative photoresist that includes the organometallic precursor 100 described herein. Method 200 is merely an example and is not intended to limit the present disclosure to what is explicitly illustrated in method 200. Additional steps may be provided before, during and after the method 200, and some steps described can be replaced, eliminated, or moved around for additional embodiments of the method. Not all steps are described herein in detail for reasons of simplicity. Method 200 is described below in conjunction with FIGS. 9-15, which are fragmentary cross-sectional views of a workpiece 300 at different stages of fabrication according to embodiments of method 200. Additionally, throughout the present application, like reference numerals denote like features, unless otherwise excepted.

Figure 9:
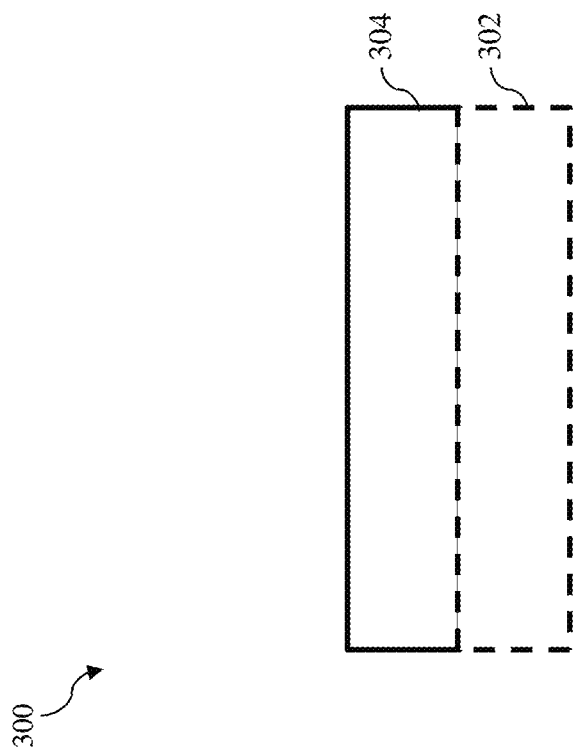
FIGS. 9-15 illustrate fragmentary cross-sectional views of a workpiece undergoing various steps of method 200 of FIG. 8, according to various aspects of the present disclosure.

Referring to FIGS. 8 and 9, method 200 includes a block 202 where a workpiece 300 is provided. The workpiece 300 includes a substrate 302 and a material layer 304 disposed over the substrate 302. It is noted that the substrate 302 is illustrated in dotted lines in FIG. 9 and will be omitted from FIGS. 10-15 for simplicity. The substrate 302 may include an elementary (single element) semiconductor, such as silicon (Si) and/or germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); a non-semiconductor material, such as soda-lime glass, fused silica, fused quartz, and/or calcium fluoride ($CaF_2$); and/or combinations thereof. In some other embodiments, the substrate 302 may be a single-layer material having a uniform composition; alternatively, the substrate 302 may include multiple material layers having similar or different compositions suitable for IC device manufacturing. In one example, the substrate 302 may be a silicon-on-insulator (SOI) substrate having a semiconductor silicon layer formed on a silicon oxide layer. The substrate 302 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

The material layer 304 over the substrate 302 represents a topmost layer on which a photoresist layer 306 (to be described below) will be deposited. That is, in some instances, the material layer 304 is to be patterned along with one or more layers underlying it. In some embodiments, the material layer 304 may be a dielectric layer that serves as a hard mask layer, a bottom antireflective coating (BARC), or an insulation layer. In these embodiments, the material layer 304 may include silicon oxide, silicon nitride, silicon oxynitride, silicon carbonitride, silicon oxycarbonitride, a metal oxide, silicon carbide, or silicon oxycarbide. Example metal oxides may include high-k dielectric materials such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), or $(Ba,Sr)TiO_3$ (BST). In some other embodiments, the material layer 304 may include a semiconductor material such as silicon (Si), germanium (Ge), gallium arsenide (GaAs), gallium phosphide (GaP), gallium nitride (GaN), or silicon germanium (SiGe). In still other embodiments, the material layer 304 may include a polymer layer, such as a polyimide layer or a polymer BARC layer. In yet still other embodiments, the material layer 304 may include a conductive material, such as titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), or copper (Cu). When the material layer 304 includes surface functional groups, such as a hydroxyl group or an amine group, the material layer 304 may form good adhesion with the subsequently deposited photoresist layer 306 as the photoresist layer 306 includes the organometallic precursor 100.

In some embodiments where the material layer 304 may catalyze pre-mature crosslinking of the photoresist layer 306 (to be described below), at block 202, a very thin silicon oxide layer or a very thin polymer layer may be deposited on the material layer 304 as a protective cap (or a capping layer) before the deposition of the photoresist layer.

Figure 10:
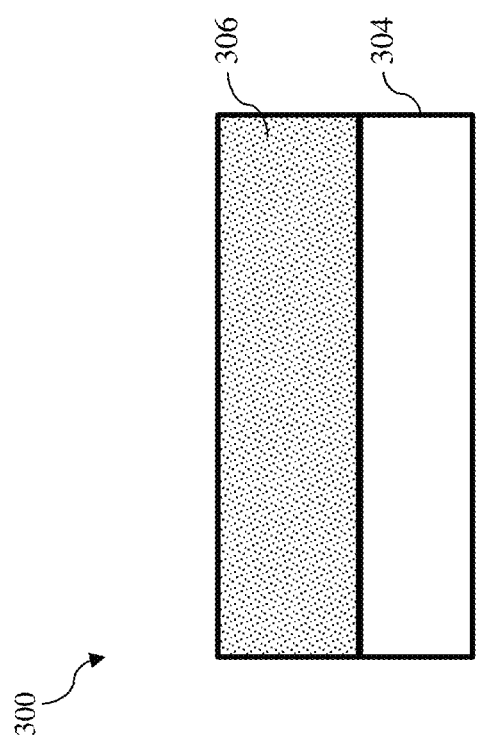

Referring to FIGS. 8 and 10, method 200 includes a block 204 where a photoresist layer 306 is deposited on the material layer 304. The photoresist layer 306 includes the organometallic precursor 100 described above and may include other additives or surfactants. The photoresist layer 306 may be a negative photoresist layer. In some embodiments, the photoresist layer 306 may be deposited using spin-on coating, chemical vapor deposition (CVD), or atomic layer deposition (ALD). When the photoresist layer 306 is deposited using spin-on coating, the organometallic precursor 100 may be dissolved or dispersed in a dispersion or a solution along with additives and surfactants and then coated on the material layer 304. Reference is briefly made to FIG. 16, because the organometallic precursor 100 in the photoresist layer 306 contains at least one unsaturated coordination site 1046 (usually about 1 to 2 unsaturated coordinate sites) that can be coordinated to a functional group or dangling bond of the material layer 304, the photoresist layer 306 may adhere well to the material layer 304 without any surfacing treatment or modification to the material layer 304, such an HMDS-pre-treatment. As an example, FIG. 16 illustrates that the organometallic precursor 100 in the photoresist layer 306 may be coordinated to a hydroxyl group of the material layer 304.

When the photoresist layer 306 is deposited using ALD or CVD, gas precursors for the organometallic precursor 100 may be directed to the material layer 304 where the gas precursors react with one another and with the material layer 304 to form the photoresist layer 306. In some instances, the gas precursors may include a first gas precursor and a second gas precursor. The first gas precursor may include a halogenated EUV-cleavable ligand 106, such as an alkene halide. The second gas precursor may include the metal ion 102 coordinated with the multidentate aromatic ligands 104 and halides. The halogen components allow the gas precursors to be in the gaseous form. During the CVD or ALD process, the material layer 304 may be heated and the halogen components may be removed when the first and second gas precursors come in contact with the heated material layer 304. In other words, when the photoresist layer 306 is deposited using ALD or CVD, the photoresist layer 306 may be formed by chemical reaction that mixing with vapor type organometallic precursor ($M_aX_bV_c$, where V is a volatility group like a halide or a halogen containing group) and vapor type EUV-cleavable ligands (L) to form the organometallic precursor 100 ($M_aX_bL_c$) and then deposited on the surface of the material layer 304.

Figure 11:
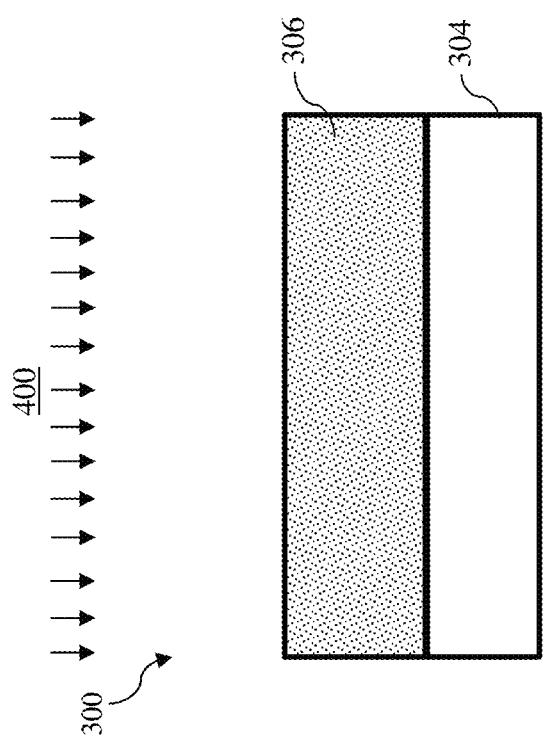

Referring to FIGS. 8 and 11, method 200 includes a block 206 where a pre-exposure treatment process 400 is performed. The pre-exposure treatment process 400 may also be referred to as a post-application treatment process 400. The pre-exposure treatment process 400 facilitates outgassing of undesirable species or removes excess moisture in the photoresist layer 306. The undesirable species may include byproducts or leaving groups during the CVD or ALD process when gaseous precursors are used to deposit the photoresist layer 306. Examples may include halide-containing species. Depending on the property of the species to be removed, the pre-exposure treatment process 400 may include a bake process, an infrared curing process, an ultraviolet (UV) curing process, or a visible light curing process. In some alternative embodiments where undesirable species are to be neutralized, the pre-exposure treatment process may include modifying the surface of the photoresist layer 306 with a reactant gas, such as silane ($SiH_4$). When the pre-exposure treatment process 400 includes a bake process, the baking temperature may be between about 60° C. and about 170° C.

Figure 12:
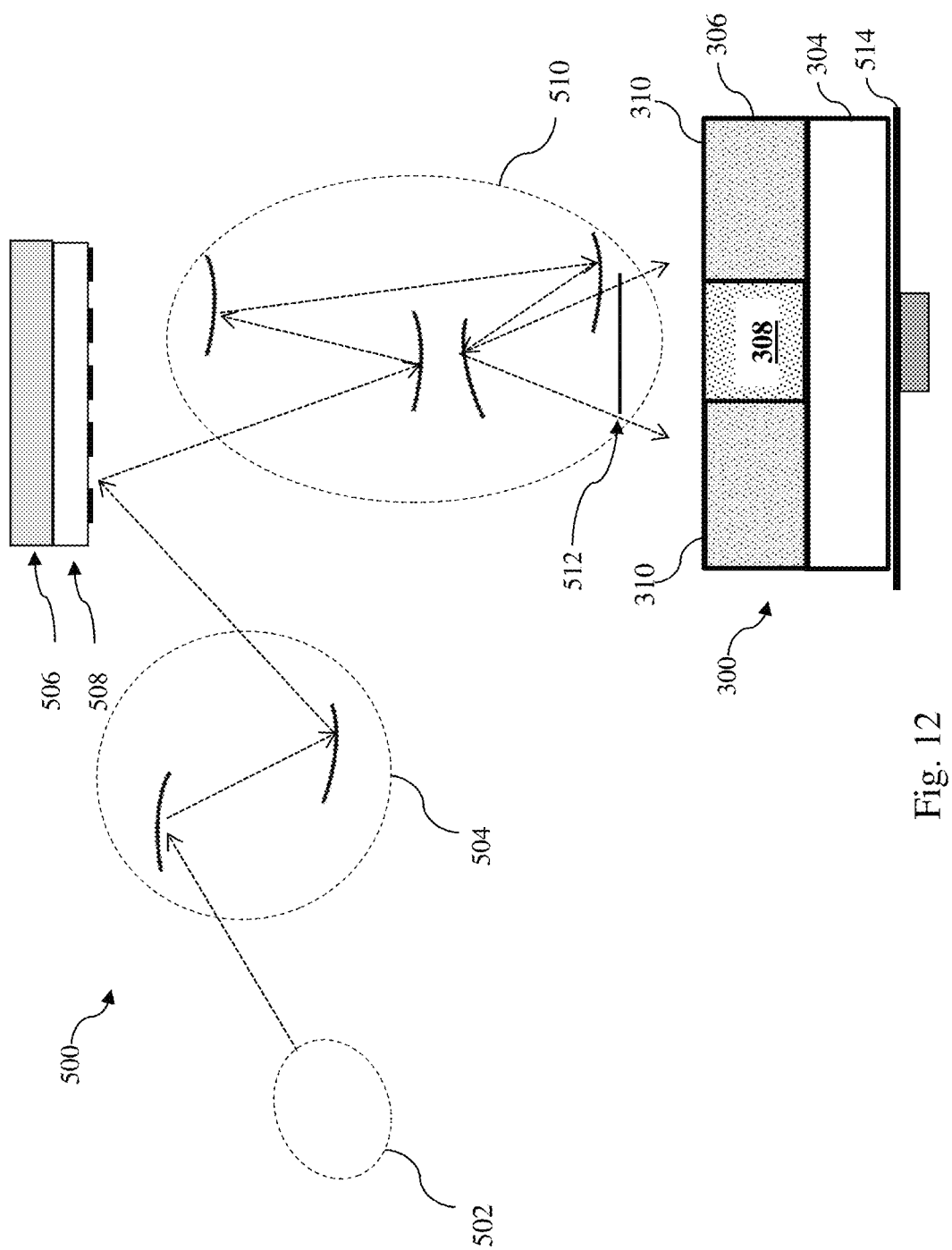

Referring to FIGS. 8 and 12, method 200 includes a block 208 where the photoresist layer 306 is exposed to a pattern of radiation. The exposure at block 208 may be performed using a lithography system 500, which is schematically shown in FIG. 12. The lithography system 500 may also be generically referred to as a scanner that is operable to perform lithographic processes including exposure with a respective radiation source and in a particular exposure mode. In at least some of the present embodiments, the lithography system 500 includes an extreme ultraviolet (EUV) lithography system designed to expose a photoresist layer, such as the photoresist layer 306, by EUV radiation. The lithography system 500 of FIG. 12 includes a plurality of subsystems such as an EUV source 502, an illuminator 504, a mask stage 506 configured to receive a mask 508, projection optics 510, and a substrate stage 514 configured to receive a workpiece, such as the workpiece 300. A general description of the operation of the lithography system 500 may be given as follows: EUV radiation from the EUV source 502 is directed toward the illuminator 504 (which includes a set of reflective mirrors) and projected onto the reflective mask 508. A reflected mask image is directed toward the projection optics 510, which focuses the EUV light and projects the EUV light onto the workpiece 300 to expose an EUV resist layer deposited thereupon. Additionally, in various examples, each subsystem of the lithography system 500 may be housed in, and thus operate within, a high-vacuum environment, for example, to reduce atmospheric absorption of EUV light.

In the embodiments described herein, the EUV source 502 may be used to generate the EUV radiation. In some embodiments, the EUV source 502 includes a plasma source, such as for example, a discharge produced plasma (DPP) or a laser produced plasma (LPP). In some examples, the EUV radiation may include radiation having a wavelength centered at about 13.5 nm. In some embodiments, the EUV source 502 also includes a collector, which may be used to collect EUV radiation generated from the plasma source and to direct the EUV radiation toward imaging optics such as the illuminator 504. As described above, EUV radiation from the EUV source 502 is directed toward the illuminator 504. In some embodiments, the illuminator 504 may include reflective optics, such as a single mirror or a mirror system having multiple mirrors in order to direct radiation from the EUV source 502 onto the mask stage 506, and particularly to the mask 508 secured on the mask stage 506. In some examples, the illuminator 504 may include a zone plate, for example, to improve focus of the EUV radiation. In some embodiments, the illuminator 504 may be configured to shape the EUV radiation passing therethrough in accordance with a particular pupil shape, and including for example, a dipole shape, a quadrupole shape, an annular shape, a single beam shape, a multiple beam shape, and/or a combination thereof. In some embodiments, the illuminator 504 is operable to configure the mirrors (i.e., of the illuminator 504) to provide a desired illumination to the mask 508. In one example, the mirrors of the illuminator 504 are configurable to reflect EUV radiation to different illumination positions. In some embodiments, a stage prior to the illuminator 504 may additionally include other configurable mirrors that may be used to direct the EUV radiation to different illumination positions within the mirrors of the illuminator 504. In some embodiments, the illuminator 504 is configured to provide an on-axis illumination (ONI) to the mask 508. In some embodiments, the illuminator 504 is configured to provide an off-axis illumination (OAI) to the mask 508. It should be noted that the optics employed in the EUV lithography system 500, and in particular optics used for the illuminator 504 and the projection optics 510, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 500 also includes the mask stage 506 configured to secure the mask 508. Since the lithography system 500 may be housed in, and thus operate within, a high-vacuum environment, the mask stage 506 may include an electrostatic chuck (e-chuck) to secure the mask 508. As with the optics of the EUV lithography system 500, the mask 508 is also reflective. As illustrated in the example of FIG. 12, radiation is reflected from the mask 508 and directed towards the projection optics 510, which collects the EUV radiation reflected from the mask 508. By way of example, the EUV radiation collected by the projection optics 510 (reflected from the mask 508) carries an image of the pattern defined by the mask 508. In various embodiments, the projection optics 510 provides for imaging the pattern of the mask 508 onto the workpiece 300 secured on the substrate stage 514 of the lithography system 500. In particular, in various embodiments, the projection optics 510 focuses the collected EUV light and projects the EUV light onto the workpiece 300 to expose the photoresist layer 306 on the workpiece 300. As described above, the projection optics 510 may include reflective optics, as used in EUV lithography systems such as the lithography system 500. In some embodiments, the illuminator 504 and the projection optics 510 are collectively referred to as an optical module of the lithography system 500.

In some embodiments, the lithography system 500 also includes a pupil phase modulator 512 to modulate an optical phase of the EUV radiation directed from the mask 508, such that the light has a phase distribution along a projection pupil plane. In some embodiments, the pupil phase modulator 512 includes a mechanism to tune the reflective mirrors of the projection optics 510 for phase modulation. For example, in some embodiments, the mirrors of the projection optics 510 are configurable to reflect the EUV light through the pupil phase modulator 512, thereby modulating the phase of the light through the projection optics 510. In some embodiments, the pupil phase modulator 512 utilizes a pupil filter placed on the projection pupil plane. By way of example, the pupil filter may be employed to filter out specific spatial frequency components of the EUV radiation reflected from the mask 508. In some embodiments, the pupil filter may serve as a phase pupil filter that modulates the phase distribution of the light directed through the projection optics 510.

As shown in FIG. 12, using the lithography system 500, an exposed portion 310 of the photoresist layer 306 is exposed to EUV radiation while an unexposed portion 308 remains unexposed. The organometallic precursors 100 in the exposed portion 310 of the photoresist layer 306 becomes crosslinked. More particularly, with reference to FIGS. 1 and 2, EUV radiation from the lithography system 500 generates radicals. The radicals cleave off the EUV-cleavable ligands 106 from the metal ion 102 and the hydrogen from the pyrrole-like nitrogen 1044. The pyrrole-like nitrogen 1044 becomes activated and coordinates with another metal ion having an uncoordinated site. The multidentate aromatic ligands 104 serve as bridge ligands to form crosslinks. With EUV-generated radicals, the same crosslinking does not take place in the unexposed portion 308.

Figure 13:
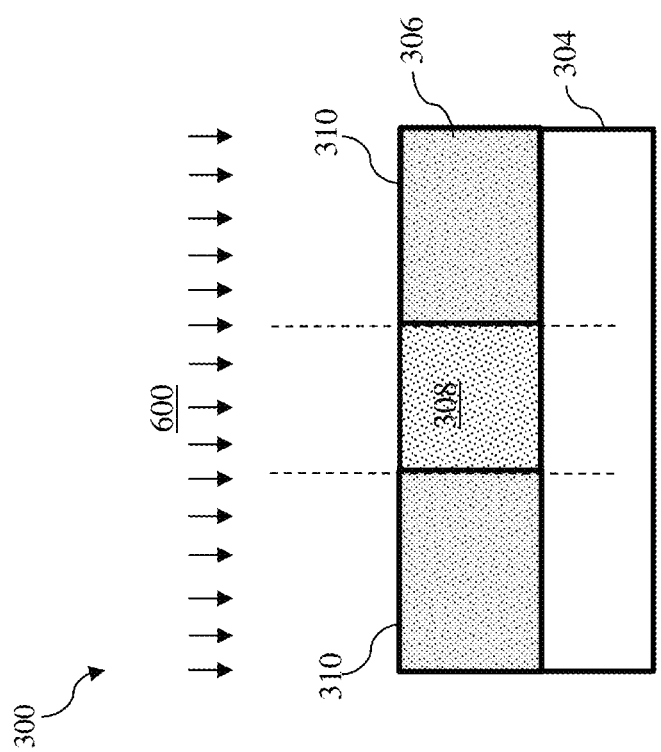

Referring to FIGS. 8 and 13, method 200 includes a block 210 where a post-exposure bake process 600 is performed. In some implementations, a baking temperature or a baking temperature profile of the post-exposure bake process 600 is selected to ensure removal of the leaving group generated during the EUV exposure process at block 208. Such leaving group corresponds to the leaving group LH described above. The baking temperature of the post-exposure bake process 600 may be between about 50° C. and about 150° C.

Figure 14:
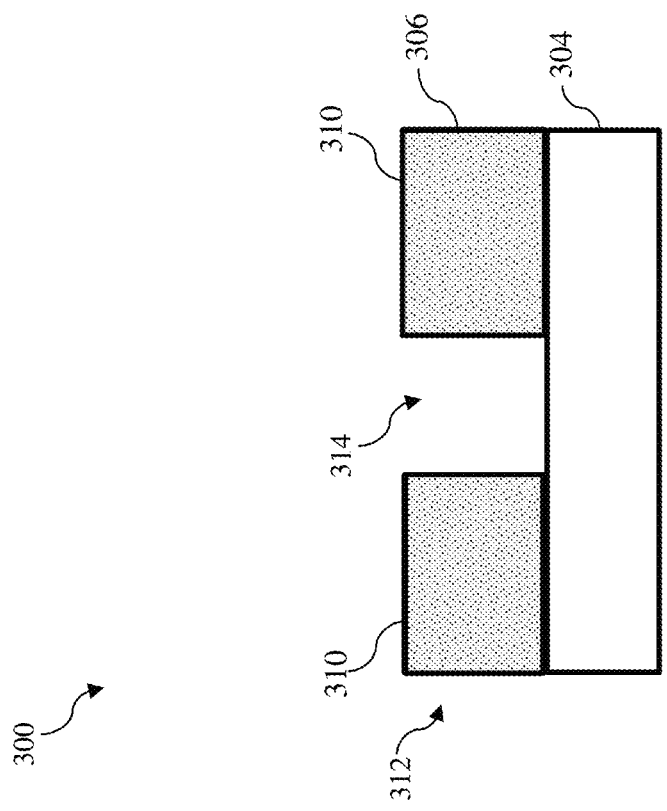

Referring to FIGS. 8 and 14, method 200 includes a block 212 where the exposed photoresist layer 306 is developed to form a patterned photoresist layer 312. At block 212, a developer solution is used to remove the unexposed portion 308, which was not crosslinked at block 208. The developer solution is selected such that it is suitable to selectively dissolve and remove the unexposed portion 308 (not crosslinked) while the exposed portion 310 (crosslinked) of the photoresist layer 306 remains substantially intact. Suitable developer solution may include solvents such as n-butyl acetate, ethanol, hexane, benzene, toluene, water, isopropyl alcohol (IPA), or 2-heptanone. In some embodiments, block 212 may also include one or more descum or rinsing processes to remove any residual photoresist layer 306 or debris. At the conclusion of operations at block 212, the patterned photoresist layer 312 is formed. Due to the removal of the unexposed portion 308, the patterned photoresist layer 312 includes an opening 314 and the material layer 304 is exposed in the opening 314.

Figure 15:
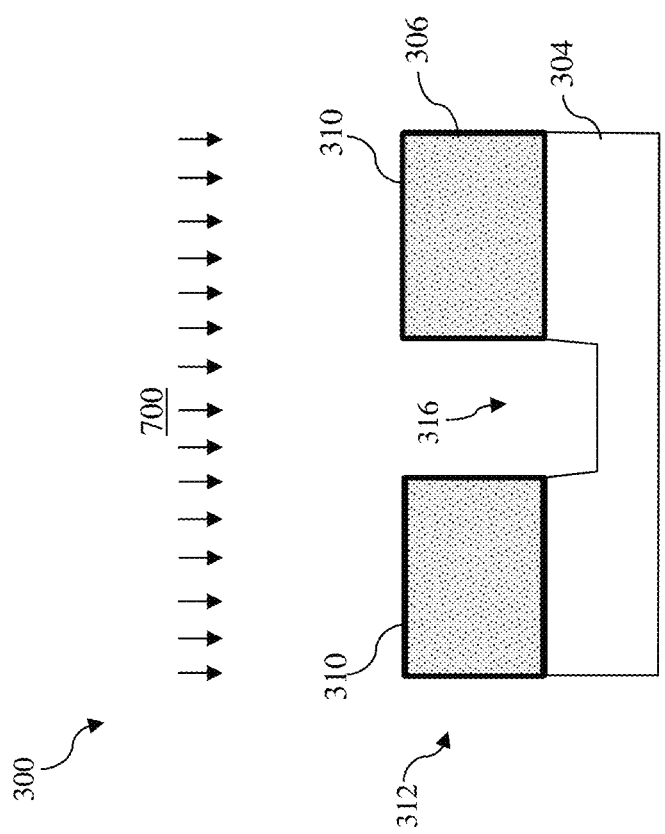

Referring to FIGS. 8 and 15, method 200 includes a block 214 where the material layer 304 is etched using the patterned photoresist layer 312 as an etch mask. In some embodiments, the material layer 304 is etched with a dry etch process 700, such as a reactive ion etch (RIE) process, using the patterned photoresist layer 312 as the etch mask. In some examples, the dry etch process 700 may be implemented using an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a nitrogen-containing gas (e.g., $N_2$), a bromine-containing gas (e.g., HBr and/or $CHBr_3$), an iodine-containing gas, other suitable gases and/or plasmas, or combinations thereof. In some embodiments represented in FIG. 15, the dry etch process 700 forms a recess 316 in the material layer 304. While the recess 316 is shown as not extending through the material layer 304, it may extend through the material layer 304 in alternative embodiments.

Although not intended to be limiting, one or more embodiments of the present disclosure provide many benefits to a semiconductor device and a formation process thereof. For example, the present disclosure provides an organometallic precursor in a negative tone photoresist. The organometallic precursor of the present disclosure includes a metal ion coordinated to a plurality of multidentate aromatic ligands and a plurality of EUV-cleavable ligands. The multidentate aromatic ligand includes a conjugation structure, a pyrrole-like nitrogen, and a pyridine-like nitrogen. The EUV-cleavable ligand includes an alkenyl group or a carboxylate group. Each of the multidentate aromatic ligands is coordinated to the metal ion via the pyrrole-like nitrogen. When the organometallic precursor is irradiated with EUV radiation, the pyrrole-like nitrogen atoms of the multidentate aromatic ligands are activated and the EUV-cleavable ligands are cleaved off of the metal ion. The activated pyrrole-like nitrogen may be coordinated to another metal ion at coordinate sites left vacant due to the cleavage of the EUV-cleavable ligands. The metal ions have high atomic absorption cross section, allowing available coordination sites to bond to various surface functional groups. The manner of crosslinking and degree of crosslinking may be well controlled by controlling the stoichiometry ratio of the EUV-cleavable ligands and the multidentate aromatic ligands.

In one exemplary aspect, the present disclosure is directed to an organometallic precursor. The organometallic precursor includes a chemical formula of MaXbLc, wherein M is a metal, X is a multidentate aromatic ligand that includes a pyrrole-like nitrogen and a pyridine-like nitrogen, L is an extreme ultraviolet (EUV) cleavable ligand, a is between 1 and 2, b is equal to or greater than 1, and c is equal to or greater than 1.

In some embodiments, a sum of b and c is less than 5. In some embodiments, the multidentate aromatic ligand includes at least one π conjugated system, the pyrrole-like nitrogen includes a lone electron pair that is a part of one of the at least one π conjugated system, and the pyridine-like nitrogen includes a lone electron pair that is not a part of any of the at least one π conjugated system. In some instances, the metal has a high atomic absorption cross section. In some implementations, the metal is selected from a group consisting of tin (Sn), bismuth (Bi), antimony (Sb), indium (In), and tellurium (Te). In some embodiments, the multidentate aromatic ligand includes a five-member aromatic ring. In some instances, the multidentate aromatic ligand further includes a six-member aromatic ring that is fused with or linked to the five-member aromatic ring. In some instances, the multidentate aromatic ligand includes pyrazole, imidazole, 1,2,4-triazole, 1,2,3-triazole, tetrazole, indazole, benzimidazole, 7-azaindole, 4-azaindole, pyrrolyl pyridine, or purine. In some embodiments, the EUV cleavable ligand includes an alkenyl group or a carboxylate group.

In another exemplary aspect, the present disclosure is directed to an extreme ultraviolet (EUV) photoresist precursor. The extreme ultraviolet (EUV) photoresist precursor includes a metal ion, an EUV cleavable ligand coordinated to the metal ion, and a multidentate ligand coordinated to the metal ion. The multidentate ligand includes at least one π conjugated system, a first nitrogen that includes a first lone electron pair, and a second nitrogen that includes a second lone electron pair. The first lone electron pair is a part of one of the at least one π conjugated system and the second lone electron pair is not included in any of the at least one π conjugated system.

In some embodiments, the first nitrogen is a pyrrole-like nitrogen and the second nitrogen is a pyridine-like nitrogen. In some embodiments, the metal ion has a high atomic absorption cross section. In some instances, the metal ion is selected from a group consisting of tin (Sn) ion, bismuth (Bi) ion, antimony (Sb) ion, indium (In) ion, and tellurium (Te) ion. In some implementations, the multidentate ligand includes a five-member aromatic ring. In some instances, the EUV cleavable ligand includes an alkenyl group or a carboxylate group.

In still another exemplary aspect, the present disclosure is directed to a method. The method includes depositing a photoresist layer directly on a material layer, wherein the photoresist layer includes a precursor that includes a metal ion, an extreme ultraviolet (EUV) cleavable ligand coordinated to the metal ion, and an aromatic ligand coordinated to the metal ion, wherein the aromatic ligand includes a pyrrole-like nitrogen and a pyridine-like nitrogen. The method further includes exposing a portion of the photoresist layer to EUV radiation to cleave off the EUV cleavable ligand from a coordination site of the metal ion, activate the pyrrole-like nitrogen, and coordinate the activated pyrrole-like nitrogen to the coordination site.

In some embodiments, the method may further include after the exposing, baking the photoresist layer to crosslink the portion of the photoresist layer. In some implementations, the material layer includes a dielectric layer, a conductive layer, a polymer layer, or a semiconductor layer. In some embodiments, the depositing of the photoresist layer includes use of spin-on coating, chemical vapor deposition (CVD), or atomic layer deposition (ALD). In some embodiments, the depositing of the photoresist layer includes use of gaseous precursors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An organometallic precursor comprising a chemical formula of $M_aX_bL_c$,
    wherein M is a metal,
    wherein X is a multidentate aromatic ligand that comprises a pyrrole-like nitrogen and a pyridine-like nitrogen,
    wherein L is an extreme ultraviolet (EUV) cleavable ligand,
    wherein a is between 1 and 2, b is equal to or greater than 1, and c is equal to or greater than 1 such that the metal has an non-coordinated site.

2. The organometallic precursor of claim 1, wherein a sum of b and c is less than 5.

3. The organometallic precursor of claim 1,
    wherein the multidentate aromatic ligand comprises at least one π conjugated system,
    wherein the pyrrole-like nitrogen comprises a lone electron pair that is a part of one of the at least one π conjugated system,
    wherein the pyridine-like nitrogen comprises a lone electron pair that is not a part of any of the at least one π conjugated system.

4. The organometallic precursor of claim 1, wherein the metal has a high atomic absorption cross section.

5. The organometallic precursor of claim 1, wherein the metal is selected from a group consisting of tin (Sn), bismuth (Bi), antimony (Sb), indium (In), and tellurium (Te).

6. The organometallic precursor of claim 1, wherein the multidentate aromatic ligand comprises a five-member aromatic ring.

7. The organometallic precursor of claim 6, wherein the multidentate aromatic ligand further comprises a six-member aromatic ring that is fused with or linked to the five-member aromatic ring.

8. The organometallic precursor of claim 1, wherein the multidentate aromatic ligand comprises pyrazole, imidazole, 1,2,4-triazole, 1,2,3-triazole, tetrazole, indazole, benzimidazole, 7-azaindole, 4-azaindole, pyrrolyl pyridine, or purine.

9. The organometallic precursor of claim 1, wherein the EUV cleavable ligand comprises an alkenyl group or a carboxylate group.

10. An extreme ultraviolet (EUV) photoresist precursor, comprising:
    a metal ion;
    an EUV cleavable ligand coordinated to the metal ion; and
    a multidentate ligand coordinated to the metal ion, the multidentate ligand comprising:
        at least one π conjugated system, a first nitrogen that includes a first lone electron pair, and a second nitrogen that includes a second lone electron pair, wherein the first lone electron pair is a part of one of the at least one π conjugated system and the second lone electron pair is not included in any of the at least one π conjugated system, wherein the metal ion comprises an non-coordinated site that is not coordinated with the EUV cleavable ligand or the multidentate ligand.

11. The EUV photoresist precursor of claim 10, wherein the first nitrogen is a pyrrole-like nitrogen and the second nitrogen is a pyridine-like nitrogen.

12. The EUV photoresist precursor of claim 10, wherein the metal ion has a high atomic absorption cross section.

13. The EUV photoresist precursor of claim 10, wherein the metal ion is selected from a group consisting of tin (Sn) ion, bismuth (Bi) ion, antimony (Sb) ion, indium (In) ion, and tellurium (Te) ion.

14. The EUV photoresist precursor of claim 10, wherein the multidentate ligand comprises a five-member aromatic ring.

15. The EUV photoresist precursor of claim 10, wherein the EUV cleavable ligand comprises an alkenyl group or a carboxylate group.

16. An extreme ultraviolet (EUV) photoresist precursor, comprising:
a metal ion;
an EUV cleavable ligand coordinated to the metal ion; and
a multidentate ligand coordinated to the metal ion, the multidentate ligand comprising:
at least one π conjugated system,
a first nitrogen that includes a first lone electron pair, and
a second nitrogen that includes a second lone electron pair, wherein the first lone electron pair is a part of one of the at least one π conjugated system and the second lone electron pair is not included in any of the at least one π conjugated system, wherein the metal ion is selected from a group consisting of tin (Sn) ion, bismuth (Bi) ion, antimony (Sb) ion, indium (In) ion, and tellurium (Te) ion, wherein the metal ion comprises an non-coordinated site that is not coordinated with the EUV cleavable ligand or the multidentate ligand.

17. The EUV photoresist precursor of claim 16, wherein the multidentate ligand comprises a single-ring multidentate aromatic ligand.

18. The EUV photoresist precursor of claim 17, wherein the single-ring multidentate aromatic ligand comprises pyrazole, imidazole, 1,2,4-triazole, 1,2,3-triazole, or tetrazole.

19. The EUV photoresist precursor of claim 16, wherein the multidentate ligand comprises a multi-ring multidentate aromatic ligand.

20. The EUV photoresist precursor of claim 19, wherein the multi-ring multidentate aromatic ligand comprises indazole, benzimidazole, 7-azaindole, 4-azaindole, pyrrolyl pyridine, or purine.

* * * * *